United States Patent
Guerin et al.

(10) Patent No.: US 8,614,512 B2
(45) Date of Patent: Dec. 24, 2013

(54) SOLDER BALL CONTACT SUSCEPTIBLE TO LOWER STRESS

(75) Inventors: Luc Guerin, Granby (CA); Mario J. Interrante, New Paltz, NY (US); Michael J. Shapiro, Austin, TX (US); Thuy Tran-Quinn, Katonah, NY (US); Van T. Truong, Brossard (CA)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/615,804

(22) Filed: Sep. 14, 2012

(65) Prior Publication Data

US 2013/0015579 A1 Jan. 17, 2013

Related U.S. Application Data

(62) Division of application No. 13/080,105, filed on Apr. 5, 2011.

(51) Int. Cl.
*H01L 29/40* (2006.01)

(52) U.S. Cl.
USPC ........... 257/779; 257/738; 257/780; 257/781; 257/E23.026

(58) Field of Classification Search
USPC ........... 257/737, 738, 780–781, 779, E23.026
See application file for complete search history.

(56) References Cited

U.S. PATENT DOCUMENTS

| | | | |
|---|---|---|---|
| 5,376,584 A | 12/1994 | Agarwala | |
| 5,889,655 A | 3/1999 | Barrow | |
| 6,542,270 B2 | 4/2003 | Perkins et al. | |
| 6,716,738 B2 | 4/2004 | Kim et al. | |
| 6,844,253 B2 | 1/2005 | Farrar | |
| 6,900,545 B1 | 5/2005 | Sebesta et al. | |
| 7,239,025 B2 | 7/2007 | Farrar | |
| 7,294,929 B2 | 11/2007 | Miyazaki | |
| 2003/0197278 A1* | 10/2003 | Joshi et al. | 257/772 |
| 2007/0029669 A1 | 2/2007 | Stepniak et al. | |
| 2007/0087544 A1 | 4/2007 | Chang et al. | |
| 2010/0193949 A1 | 8/2010 | Belanger et al. | |
| 2012/0007233 A1* | 1/2012 | Kuo et al. | 257/737 |

OTHER PUBLICATIONS

U.S. Appl. No. 13/080,105, filed Apr. 5, 2011, Notice of Allowance Communication, Oct. 19, 2012, 8 pages.
U.S. Appl. No. 13/080,105, Office Action Communication, Apr. 26, 2012, pp. 1-11.
U.S. Appl. No. 13/080,105, Office Action Communication, Jun. 8, 2012, pp. 1-16.

* cited by examiner

*Primary Examiner* — Thanhha Pham
(74) *Attorney, Agent, or Firm* — Gibb & Riley, LLC; Joseph P. Abate, Esq.

(57) ABSTRACT

A solder ball contact and a method of making a solder ball contact includes: a first insulating layer with a via formed on an integrated circuit (IC) chip and a metal pad; an under bump metallurgy (UBM) structure disposed within the via and on a portion of the first insulating layer, surrounding the via; a second insulating layer formed on an upper surface of an outer portion of the UBM structure that is centered on the via; and a solder ball that fills the via and is disposed above an upper surface of an inner portion of the UBM structure that contacts the via, in which the UBM structure that underlies the solder ball is of a greater diameter than the solder ball.

18 Claims, 8 Drawing Sheets

(2A)

(2B)

(2C)

(2D)

SOLDER BALL CONTACT SUSCEPTIBLE TO LOWER STRESS

CROSS-REFERENCE TO RELATED APPLICATIONS

The present invention claims the benefit under 35 U.S.C. §120 as a divisional of presently pending U.S. patent application Ser. No. 13/080,105 filed on Apr. 5, 2011, the entire teachings of which are incorporated herein by reference.

BACKGROUND

1. Field of the Invention

The embodiments herein generally relate to controlled collapse chip connections (C4) in the packaging of semiconductor chips. In particular, the embodiments herein relate to a structure and method of manufacturing a solder ball contact that includes a solder ball, an under bump metallurgy (UBM) structure that underlies the solder ball and is of a greater diameter than the solder ball, and a nitride layer that overlies a portion of the UBM structure and delimits a diameter of the solder ball.

2. Description of Related Art

In controlled collapse chip connection (C4) methodology, solder ball contacts include solder bumps or balls that are formed on under bump metallurgy (UBM) structures, which are formed on a wafer of integrated circuit (IC) chips. The UBM structure includes a stack of metal layers that are connected to an underlying metal pad, formed on an upper surface of an IC chip. Ideally, the UBM structure should provide good adhesion to the underlying IC chip through the back-end-of-line (BEOL) processes, including chip attachment to the packaging laminate.

Referring to FIG. 1, a conventional solder ball contact includes a solder ball 160 and a UBM structure 130. The UBM structure 130 is formed on a bottom and sides of a via 150, disposed within an insulating layer 120, and on a portion of an upper surface of the insulating layer 120 that surrounds the via 150. The via 150 contacts a metal pad 110 that is formed on a topmost layer of an IC chip 105 from which a passivation layer has been removed. The metal pad 110, in turn, contacts an underlying metallization layer or a through-silicon-via of the IC chip 105.

The UBM structure 130 includes: a lowermost titanium-tungsten (TiW) base layer 132 that provides good adhesion to the insulating layer 120; an overlying copper (Cu) seed layer 134 that forms an efficient electrical conductor; and an uppermost nickel (Ni) barrier layer 136 that separates the Cu seed layer from the solder ball 160. As known in the art, a solder contact can be formed that fills the via 150, extends above the Ni barrier layer 136, and extends outwardly to cover the UBM structure 130. The solder contact is then reflowed to form a solder ball 160, which has a diameter roughly equal to that of the UBM structure 130.

As shown in the related art, an edge of a solder ball needs not overlie a peripheral edge of the underlying UBM structure. Referring to FIGS. 2A-D, a UBM structure and a solder ball are formed by selectively depositing solder on exposed portions of a planar metal stack through a hole in a second insulating layer. A second insulating layer 260, e.g., a polyimide, is deposited over a first insulating layer 220 and over planar metal stacks 250, which are connected by vias 240 to a next-to-last layers of metallurgy 230 of an underlying IC chip, as shown in FIG. 2A. The planar metal stacks 250 contain a zirconium (Zr) base layer, a Ni layer formed on the Zr base layer, a Cu layer formed on Ni layer, a gold (Au) layer formed on the Cu layer, and a topmost lead (Pb) layer. A patterned photoresist layer 270 is deposited over the second insulating layer 260, and holes are then formed through the second insulating layer 260 to the underlying planar metal stacks 250, forming through holes 280, as shown in FIG. 2B. The photoresist layer 270 is then removed. In an embodiment of the conventional method, lead-tin (Pb—Sn) solder, bismuth (Bi) solder, or other solder is selectively deposited on exposed portions of the planar metal stacks 250, forming solder contacts 200 in the through holes of the second insulating layer 260 by immersing the IC wafer in molten solder, FIG. 2C. The molten solder selectively attaches to the exposed portions of the planar metal stacks 250 upon contact to form solder contacts 200. In another embodiment of the conventional method, chemical vapor depositions of the metal species of the solder are preferentially absorbed on the exposed portions of the planar metal stacks 250 to form the solder contacts 200. With either conventional method, the solder contacts 200 may then be reflowed, as is known in the art, to form solder balls 210, as shown in FIG. 2D.

There remains a need for a solder ball contact and a method of manufacturing the solder ball contact that reduces delamination failures between the IC chip and packaging laminate during the back-end-of-line (BEOL) processes.

SUMMARY

In view of the foregoing, an exemplary embodiment herein discloses a solder ball contact including: a first insulating layer disposed on an integrated circuit (IC) chip and a metal pad, the first insulating layer including a via to the metal pad; an under bump metallurgy (UBM) structure disposed on sides of the via, on a top surface of the metal pad, and on a portion of a top surface of the first insulating layer, surrounding the via; a second insulating layer disposed on an upper surface of an outer portion of the UBM structure that is centered on the via; and a solder ball that fills the via and is disposed above the upper surface of an inner portion of the UBM structure that contacts the via.

An exemplary embodiment herein discloses a method of manufacturing a solder ball contact including: forming a first insulating layer disposed on an integrated circuit (IC) chip and a metal pad, the first insulating layer including a via to the metal pad; forming an under bump metallurgy (UBM) structure disposed on sides of the via, on a top surface of the metal pad, and on a portion of a top surface of the first insulating layer, surrounding the via; forming a second insulating layer disposed on an upper surface of an outer portion of the UBM structure, surrounding the via; and forming a solder ball that fills the via and is disposed above an upper surface of an inner portion of the UBM structure, surrounding the via.

An exemplary embodiment herein discloses a method of manufacturing a solder ball contact including: forming, sequentially, a base layer, a highly conductive layer, and a second insulating layer over a first insulating layer, which includes a first via to a metal pad formed on an integrated circuit (IC) chip; forming a first photoresist, including a second via centered on and having a greater diameter than the first via, to expose a first portion of the second insulating layer within the first and second vias; removing the first portion of the second insulating layer; forming a barrier layer on the highly conductive layer within the first and second vias; forming a solder contact on the barrier layer within the first and second vias; removing the first photoresist; forming a second photoresist on the solder contact and a second portion of the second insulating layer that surrounds the solder contact; removing the second insulating layer, the highly conductive layer, and the base layer not covered by the second photoresist; removing the second photoresist to expose the solder contact, which overlies an under bump metallurgy (UBM) structure including the barrier layer, the highly conductive layer, and the base layer; and reflowing the solder contact to form a solder ball contact.

An exemplary embodiment herein discloses a method of manufacturing a solder ball contact including: depositing and patterning a first insulating layer on an integrated circuit (IC) chip and a metal pad, the first insulating layer including a first via to the metal pad; depositing a base layer on the first insulating layer, including sides of the first via, and on a top surface of the metal pad; forming a highly conductive layer on the base layer; depositing a second insulating layer on the highly conductive layer; depositing and patterning a first photoresist to include a second via that shares a central axis with and has a greater diameter than the first via, the second via exposing a first portion of the second insulating layer located within the first and second vias; removing the first portion of the second insulating layer; forming a barrier layer on the highly conductive layer within the first and second vias; forming a solder contact on the barrier layer within the first and second vias; removing the first photoresist; depositing and patterning a second photoresist above the solder contact and a second portion of the second insulating layer that surrounds the solder contact; removing the second insulating layer, the highly conductive layer, and the base layer not covered by the second photoresist; removing the second photoresist to expose the solder contact, which overlies an under bump metallurgy (UBM) structure including the barrier layer, the highly conductive layer, and the base layer; and reflowing the solder contact to form a solder ball contact.

BRIEF DESCRIPTION OF THE DRAWINGS

The exemplary embodiments herein will be better understood from the following detailed description with reference to the drawings, which are not necessarily drawn to scale and in which.

DETAILED DESCRIPTION

Figure 1:
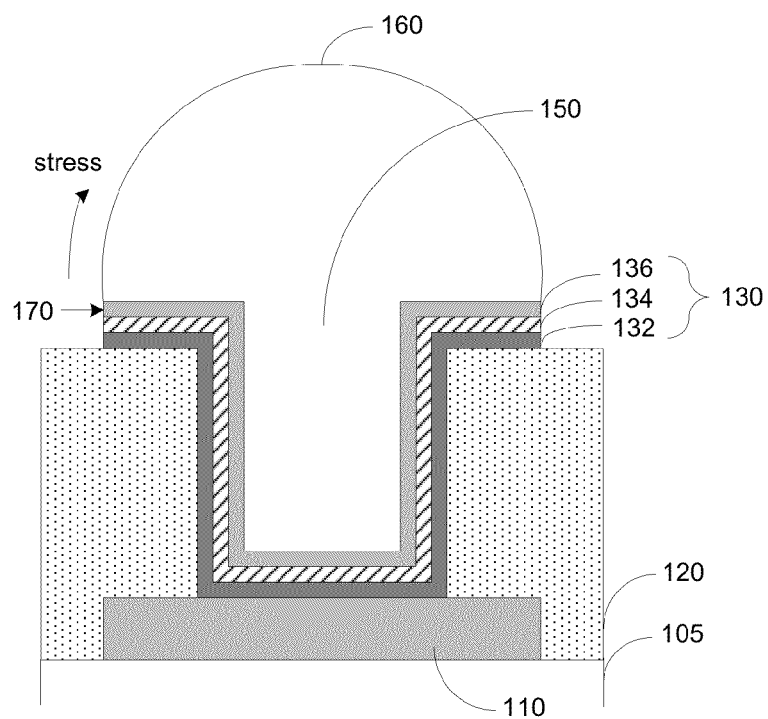
FIG. 1 is a schematic diagram illustrating, in cross section, a solder ball contact including a solder ball and a under ball metallurgy (UBM) structure in the related art.

The exemplary embodiments herein and the various features and advantageous details thereof are explained more fully with reference to the non-limiting exemplary embodiments that are illustrated in the accompanying drawings and detailed in the following description. It should be noted that the features illustrated in the drawings are not necessarily drawn to scale. Descriptions of well-known materials, components, and processing techniques are omitted so as to not unnecessarily obscure the exemplary embodiments herein. The examples used herein are intended to merely facilitate an understanding of ways in which the exemplary embodiments herein may be practiced and to further enable those skilled in the art to practice the exemplary embodiments herein. Accordingly, the examples should not be construed as limiting the scope of the exemplary embodiments herein. As described above, there remains a need for a solder ball contact structure and a method of manufacturing the solder ball contact that reduces delamination failures between the IC chip and packaging laminate during the back-end-of-line (BEOL) processes.

Delamination failures may be characterized by "unzipping" of a metal stack of the under bump metallurgy (UBM) structure from the underlying IC chip. It is thought that mechanical stresses may be transmitted from the packaging laminate through the solder ball to an underlying edge of the underlying UBM structure during chip attachment. These mechanical stresses may be caused by different coefficients of thermal expansion/contraction of the packaging laminate and the IC chip, as transmitted by the cooling and hardening solder ball during chip attachment. Differences in heating and cooling rates of particular solder contacts, which vary in size or location on the IC chip, may also contribute to variations of applied mechanical stresses during chip attachment. The ability of an organic insulating layer, e.g., a polyimide layer, disposed beneath the UBM structure, to "cushion" the UBM structure from mechanical stresses may also reduce the mechanical stresses applied. The sum of these mechanical stresses may result in shear between a comparatively rigid, i.e., cooled or cooling, peripheral edge of a solder ball contact and an edge of the UBM structure, which directly underlies the outer edge of the solder ball contact.

Figure 3:
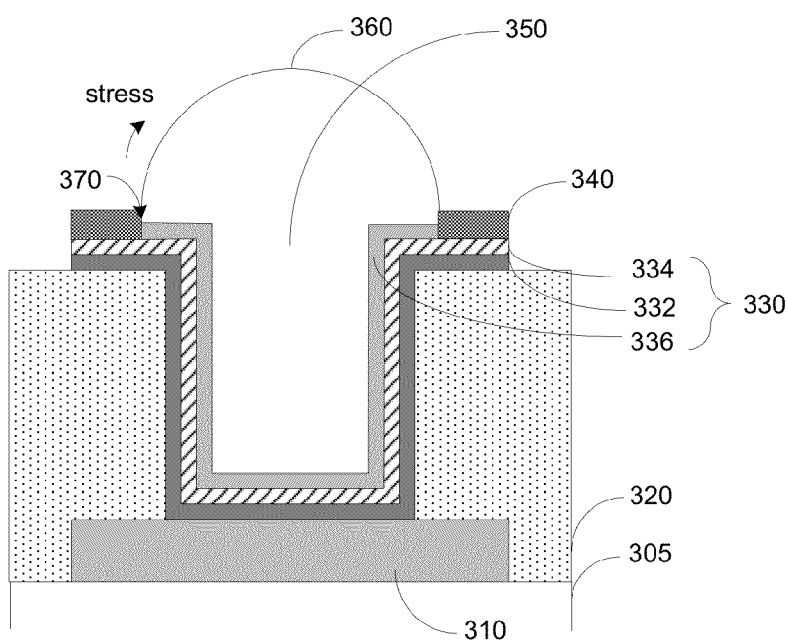
FIG. 3 is a schematic diagram illustrating, in cross section, a solder ball contact including a solder ball and a under ball metallurgy (UBM) structure in an exemplary embodiment herein.
Figure 2A:
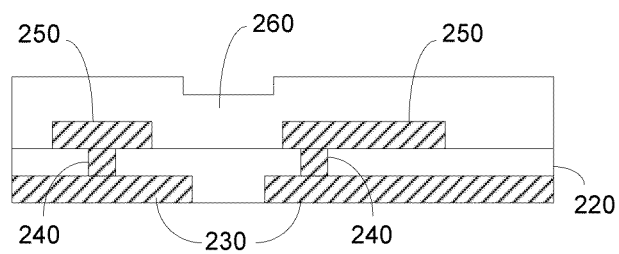
FIG. 2A is a schematic diagram illustrating, in cross section, a method of making a solder ball contact including forming a second insulating layer over a first insulating layer and over metal stacks, which are connected by vias to a next-to-last layers of metallurgy of an underlying IC chip in the related art.
Figure 2B:
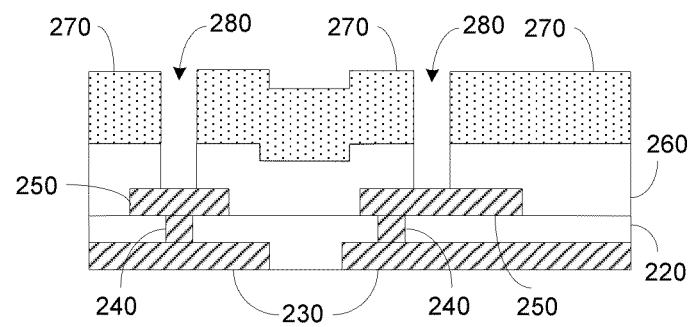
FIG. 2B is a schematic diagram illustrating, in cross section, a method of making a solder ball contact also including forming a photoresist layer over the second insulating layer, and forming holes through the second insulating layer to the underlying planar metal stacks in the related art
Figure 2C:
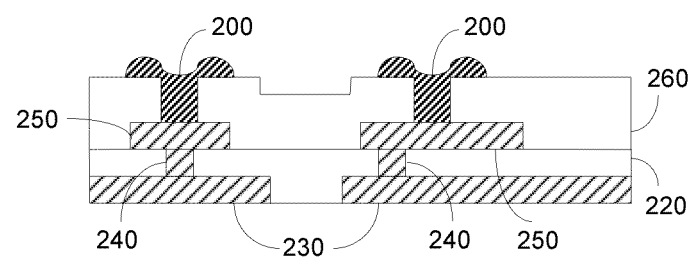
FIG. 2C is a schematic diagram illustrating, in cross section, a method of making a solder ball contact further including forming solder contacts on exposed portions of the planar metal stacks by immersing the IC wafer in molten solder in the related art.
Figure 2D:
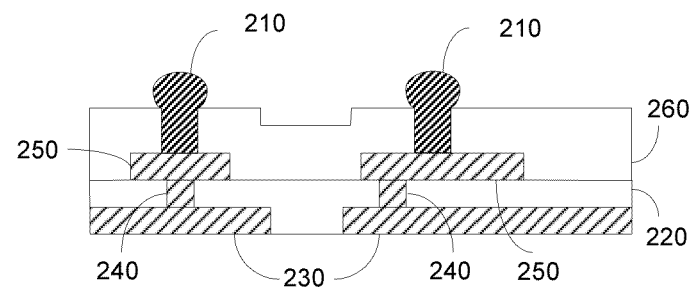
FIG. 2D is a schematic diagram illustrating, in cross section, a method of making a solder ball contact yet further including reflowing the solder contacts to form solder balls in the related art.

In contrast to forming a solder ball of roughly the same diameter as the underlying UBM structure 130, as shown in FIG. 1 of the related art, the embodiments herein may reduce delamination failures during chip attachment by forming a solder ball of lesser diameter than the underlying UBM structure. Referring to FIG. 3, a solder ball 360, having a diameter less than that of the UBM structure 330, may cause an applied mechanical stress to be applied to an "inner edge" 370 of the UBM structure 330. In FIG. 3, the moment of mechanical force at this "inner edge" 370 and thus, the applied mechanical stress, is reduced, when compared to the moment of mechanical force that is applied to the outer edge 170 of the UBM structure in the conventional solder ball contact of FIG. 1.

Referring to FIG. 3, the solder ball contact, of an exemplary embodiment herein, may include: a first insulating layer 320 disposed on an integrated circuit (IC) chip 305 and a metal pad 310, in which the first insulating layer 320 includes a via 350 that penetrates to a top surface of the metal pad; an under bump metallurgy (UBM) structure 330 disposed on sides of the via 350, on the top surface of said metal pad 310, and on a portion of a top surface of the first insulating layer 320 that surrounds the via 350; a second insulating layer 340 disposed on an upper surface of an outer portion of said UBM structure 330 that is centered on the via 350; and a solder ball 360 that fills the via 350 and is disposed above the upper surface of an inner portion of said UBM structure 330 that contacts the via 350.

The metal pad 310 may include layers of titanium (Ti), having a thickness of from 200 to 400 Å, and aluminum (Al), having a thickness of from 1.0 to 2.0 μm; alternatively, the metal pad 310 may include a layer of titanium and tungsten (TiW), having a thickness of from 200 to 400 μm. The first insulating layer 320, disposed on the metal pad 310 and the IC chip 305, may include any of a polyimide, polybenzoxazole (PBO) and bisbenzocyclotene (BCB), having a thickness of from 5.0 to 7.0 μm in an exemplary embodiment herein.

In various exemplary embodiments herein, the UBM structure 330 may include: a base layer 332 of any of TiW, Ti, and a chromium/chromium-copper alloy (Cr/CrCu) having a thickness of from 100 to 300 Å; a highly conductive layer 334 of any of copper (Cu), gold (Au) and aluminum (Al) having a thickness of from 2000 to 2500 Å; and a barrier layer 336 of any of nickel (Ni), an iron-nickel alloy (FeNi), cobalt (Co), tantalum (Ta), and a cobalt-iron alloy (CoFe) having a thickness of from 1 μm to 4 μm.

The surface area of the UBM structure 330, which is disposed on the bottom and sides of the via 350 and on a portion of the first insulating layer 320, when compared to the surface area of the planar metal stack 150 of FIG. 1, is comparatively greater and may provide greater electrical conductivity for electroplating of the barrier layer 336 and of a solder contact, which may be reflowed to form the solder ball 360. In an exemplary embodiment herein, the solder ball 360 may include a lead (Pb)-free solder that may include any of tin (Sn), silver (Ag), Cu, bismuth (Bi), zinc (Zn), and antimony (Sb).

In an exemplary embodiment herein, a second insulating layer 340 may be disposed on an upper surface of an outer portion of the UBM structure 330 that is centered on the via 350. The second insulating layer may include a silicon nitride or silicon oxide layer having a thickness of from 700 to 1200 Å in an exemplary embodiment herein. The second insulating layer 340 may extend inwardly from an outer boundary of the UBM structure 330, to an inner edge 370, which has a diameter greater than that of the via 350.

In an exemplary embodiment herein, the solder ball 360 may fill the via 350 and extend above an inner portion of the UBM structure 330, defined by an uppermost portion of the barrier layer 336 and that portion of the barrier layer 336, which is formed on and contacts the sides of the via 350. The inner edge 370 of the second insulating layer 340 may delimit a diameter of the solder ball 360, because the solder ball 360 is shaped by the surface tension of the reflowed solder, which does not "wet" the adjacent outer portion of the second insulating layer 340. Thus, a diameter of the solder ball 360 may be greater than a diameter of the via and less than an outer diameter of the UBM structure. Preferably, the diameter of the solder ball 360 may be 60% to 90% of the outer diameter of the UBM structure 330.

Figure 4:
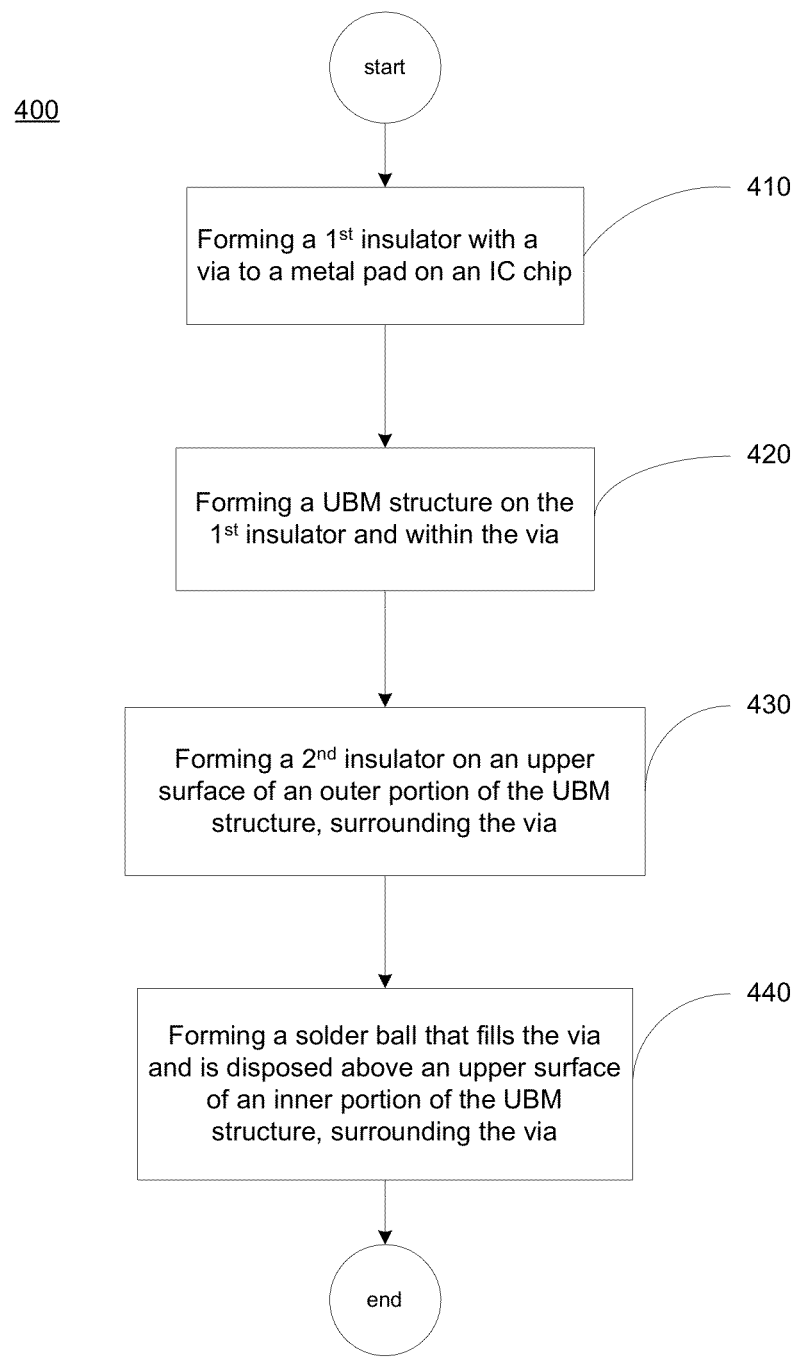
FIG. 4 is a flow chart illustrating a method of making a solder ball contact in an exemplary embodiment herein.

Referring to FIG. 4, a flow chart 400 illustrates a method of making a solder ball contact in an exemplary embodiment herein. The method may include forming a first insulating layer disposed on an IC chip and a metal pad, in which the first insulating layer includes a via to the metal pad 410. The via may expose a top surface of the metal pad. The method may also include forming a UBM structure disposed on sides of the via, on a top surface of the metal pad, and on a portion of a top surface of the first insulating layer, which surrounds the via 420. Forming the UBM structure may include; forming a base layer on sides of the via, on a top surface of the metal pad, and on a portion of a top surface of the first insulating layer that surrounds the via; forming a highly conductive layer on the base layer, and forming a barrier layer on the highly conductive layer, except on an outer portion of the highly conductive layer, which is disposed above the portion of a top surface of the first insulating layer that surrounds the via. The method may further include forming a second insulating layer disposed on an upper surface of an outer portion of the UBM structure, which surrounds the via 430. Forming of the second insulating layer may precede the forming of the barrier layer. The method may yet further include forming a solder ball that fills the via and is disposed above an upper surface of an inner portion of the UBM structure, which surrounds the via 440. The forming of the solder ball may include the reflowing of a solder contact that is formed on the barrier layer.

Referring to FIGS. 5-17, a method of making a solder ball contact, according to an exemplary embodiment herein, is illustrated. Each of the figures illustrates a cross-section of a roughly circular solder ball contact formed on an IC chip in an exemplary embodiment herein.

Figure 5:
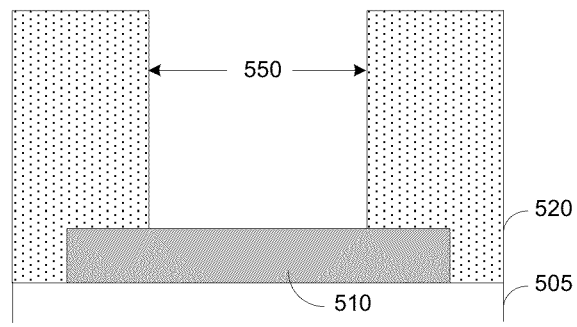
FIG. 5 is a schematic diagram illustrating, in cross section, a method of making a solder ball contact including forming a first insulating layer, including a first via to a metal pad, which is formed on an IC chip in an exemplary embodiment herein.

Referring to FIG. 5, a first insulating layer 520 may be deposited and patterned on an IC chip 505. The first insulating layer 520 may include a first via 550, which exposes a portion of a top surface of a metal pad 510, formed on the IC chip 505 in an exemplary embodiment herein. The metal pad 510 may be formed on a portion of the IC chip 505 from which a topmost passivation layer has been removed. The metal pad 510 may contact a metallization layer or a through-silicon-via of the IC chip 505. The first insulating layer 520 may include any of a photosensitive polyimide, polybenzoxazole (PBO) and bisbenzocyclotene (BCB) to facilitate patterning and to cushion the to-be-formed UBM structure against delaminating stress during chip attachment. An adhesion promoter may be applied to the metal pad 510 before the first insulating layer 520 is deposited, and the first insulating layer 520 may be planarized after deposition and patterning.

Figure 6:
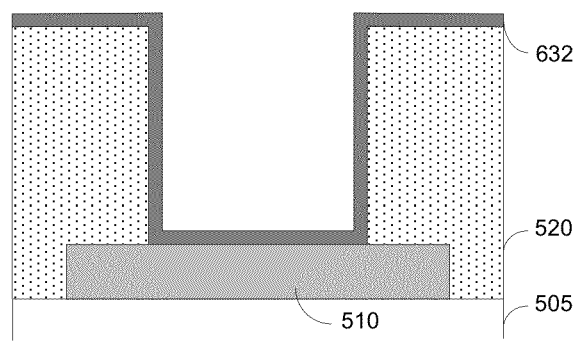
FIG. 6 is a schematic diagram illustrating, in cross section, a method of making a solder ball contact also including forming a base layer on the first insulating layer in an exemplary embodiment herein.

Referring to FIG. 6, a base layer 632 may be deposited by sputtering on the first insulating layer 520, including sides of the first via 550, and on a top surface of the metal pad 510 in an exemplary embodiment herein. The base layer may include any of a TiW, Ti, and Cr/CrCu layer that adheres well to the first insulating layer.

Figure 7:
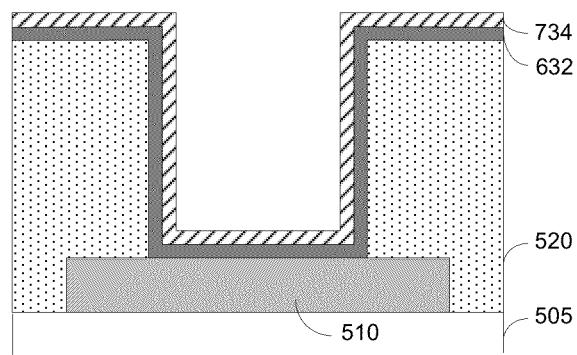
FIG. 7 is a schematic diagram illustrating, in cross section, a method of making a solder ball contact further including forming a highly conductive layer on the base layer in an exemplary embodiment herein.

Referring to FIG. 7, a highly conductive layer 734 may be formed from a sputtered seed layer deposited on the base layer 632 in an exemplary embodiment herein. The highly conductive layer 734 may include any of Cu, Au, and Al to facilitate subsequent electroplating of a barrier layer.

Figure 8:
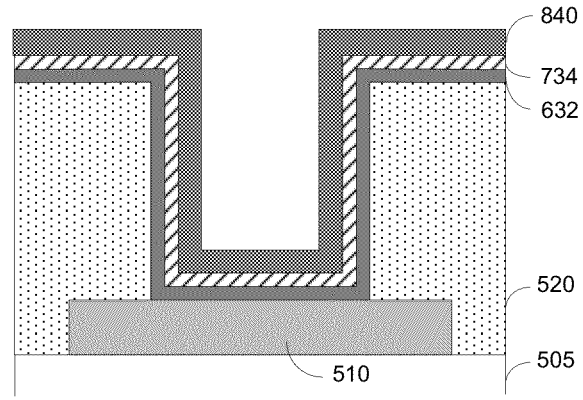
FIG. 8 is a schematic diagram illustrating, in cross section, a method of making a solder ball contact yet further including forming a second insulating layer on the highly conductive layer in an exemplary embodiment herein.

Referring to FIG. 8, a second insulating layer 840 may be deposited by chemical vapor deposition on the highly conductive layer 734 at a temperature of about 260° C. in an exemplary embodiment herein. The second insulating layer 840 may include a protective layer for an outer portion of the to-be-formed UBM structure.

Figure 9:
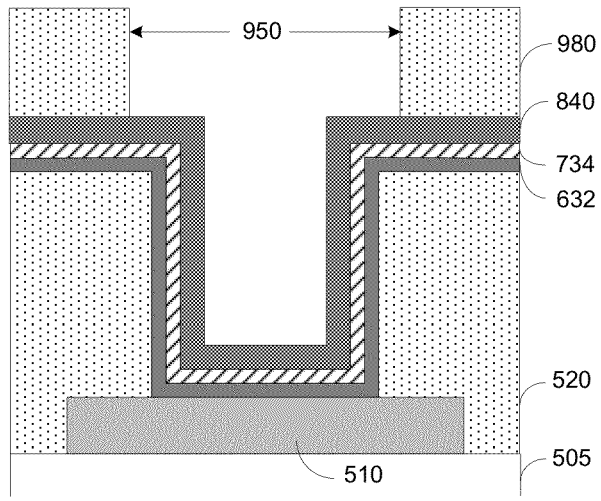
FIG. 9 is a schematic diagram illustrating, in cross section, a method of making a solder ball contact yet further including forming a first photoresist, including a second via, over the second insulating layer in an exemplary embodiment herein.

Referring to FIG. 9, a first photoresist 980 may be deposited and patterned over the second insulating layer 840 to form a second via 950, which shares a central axis with and has a greater diameter than the first via 550, in an exemplary embodiment herein. The patterned first photoresist 980, located above the uppermost portions of the second insulating layer 840, may have a thickness of about 65 μm. The patterned first photoresist 980 may expose a first portion of the second insulating layer 840, located within the first and second vias 550, 950.

Figure 10:
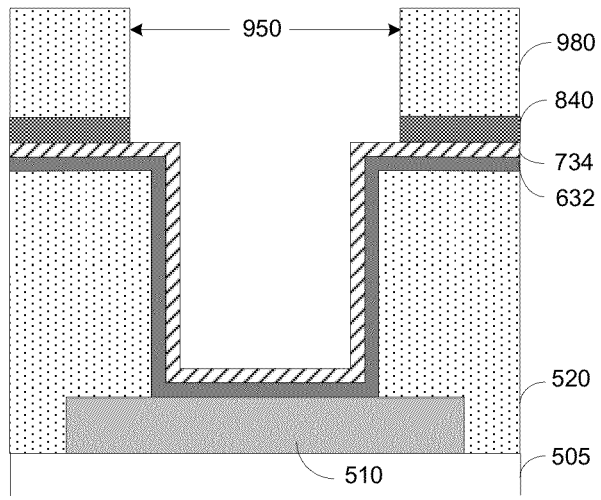
FIG. 10 is a schematic diagram illustrating, in cross section, a method of making a solder ball contact yet further including removing a first portion of the second insulating layer, located within the first and second vias to expose the underlying highly conductive layer in an exemplary embodiment herein.

Referring to FIG. 10, the first portion of the second insulating layer 840, located within the first and second vias 550, 950, may be removed by a controlled dry etch, to expose the underlying highly conductive layer 734 located within the first and second vias 550, 950 in an exemplary embodiment herein.

Figure 11:
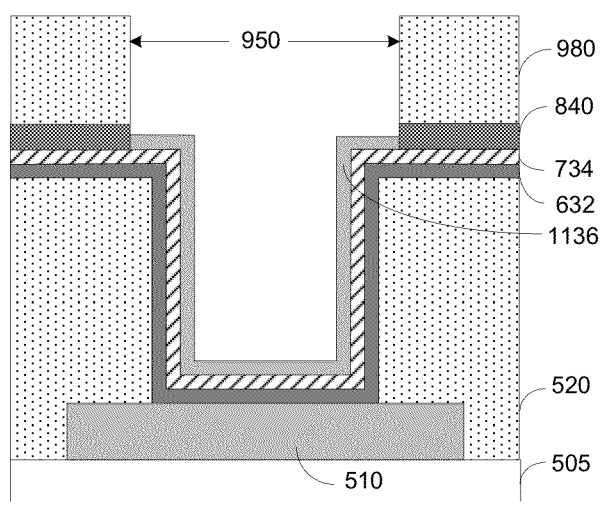
FIG. 11 is a schematic diagram illustrating, in cross section, a method of making a solder ball contact yet further including forming a barrier layer on the highly conductive layer in an exemplary embodiment herein.

Referring to FIG. 11, a barrier layer 1136, which separates the underlying highly conductive Cu layer from a to-be formed overlying solder contact, may be formed by electroplating any of a Ni, FeNi, Co, Ta, and CoFe on the highly conductive layer 734, exposed within the first and second vias 550, 950 in an exemplary embodiment herein. The barrier layer 1136 may have a thickness ranging from 1 μm to 4 μm.

Figure 12:
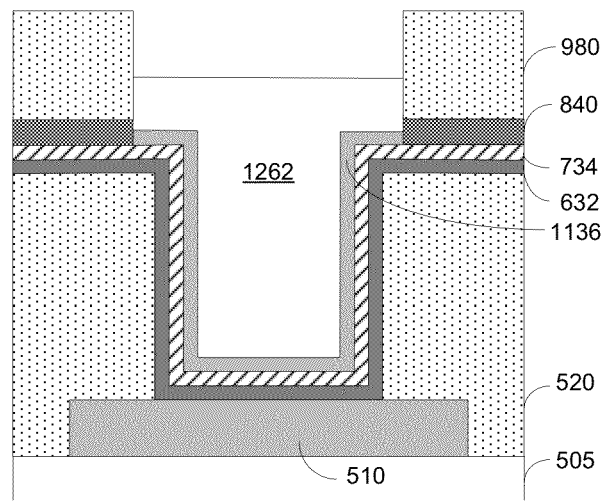
FIG. 12 is a schematic diagram illustrating, in cross section, a method of making a solder ball contact yet further including forming a solder contact on the barrier layer in an exemplary embodiment herein.

Referring to FIG. 12, a solder contact 1262 may be formed by electroplating, screening, or vapor depositing a solder on the barrier layer 1136 located within the first and second vias 550, 950 in an exemplary embodiment herein. Within the second via 950, the solder, forming the solder contact 1262, may be formed to a level above that of a top surface of a second portion of the second insulating layer 840 that surrounds the second via 950 and is covered by the patterned first photoresist 980. A top surface of the solder contact 1262, located within the second via 980, may extend to within about 10 μm of an uppermost surface of the patterned first photoresist 980.

Figure 13:
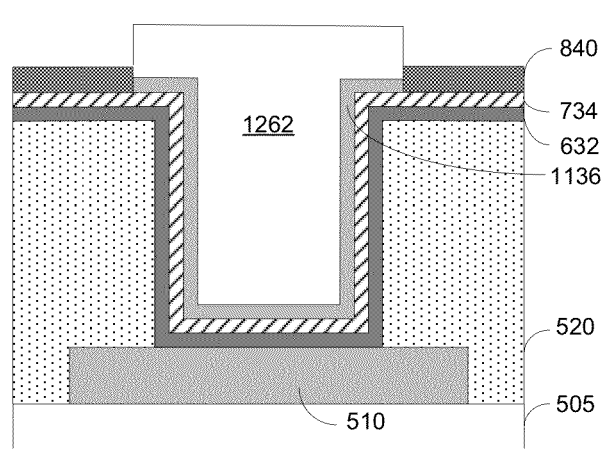
FIG. 13 is a schematic diagram illustrating, in cross section, a method of making a solder ball contact yet further including removing the first photoresist to expose the solder contact and the second insulating layer that surrounds the solder contact in an exemplary embodiment herein.

Referring to FIG. 13, the patterned first photoresist 980 may be removed by wet stripping to expose the solder contact 1262 and the second insulating layer 840 that surrounds the solder contact 1262 and is at a lower level than the solder contact 1262 in an exemplary embodiment herein.

Figure 14:
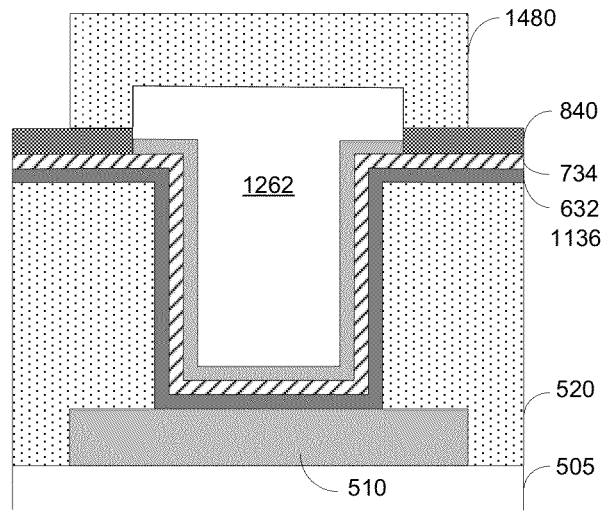
FIG. 14 is a schematic diagram illustrating, in cross section, a method of making a solder ball contact yet further including forming a second photoresist over the solder contact and the second portion of the second insulating layer that surrounds the solder contact in an exemplary embodiment herein.

Referring to FIG. 14, a second photoresist 1480 may be deposited by spinning and then patterned, such that the second photoresist 1480 is disposed over the solder contact 1262 and a second portion of the second insulating layer 840 that surrounds the solder contact 1262 in an exemplary embodiment herein. An outer diameter of the patterned second photoresist 1480, overlying the solder contact 1262 and the second portion of the second insulating layer 840, may define the outer diameter of the to-be-formed under bump metallurgy structure.

Figure 15:
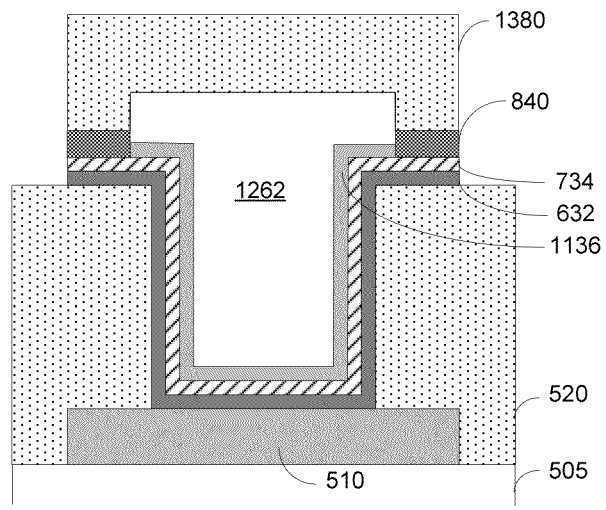
FIG. 15 is a schematic diagram illustrating, in cross section, a method of making a solder ball contact yet further including removing the second insulating layer, the highly conductive layer, and the base layer that are not covered by the second photoresist in an exemplary embodiment herein.

Referring to FIG. 15, the second insulating layer 840 may be removed by a dry etch, and the highly conductive layer 734 and the base layer 632 may be removed by a wet etch from those areas of the first insulating layer 520, which are not covered by the patterned second photoresist 1380 in an exemplary embodiment herein.

Figure 16:
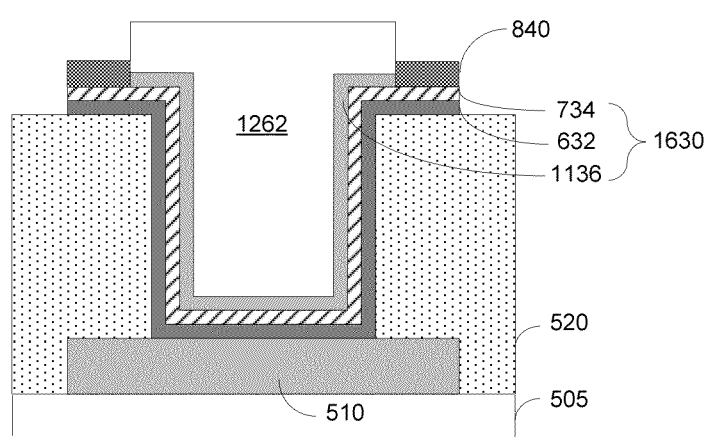
FIG. 16 is a schematic diagram illustrating, in cross section, a method of making a solder ball contact yet further including removing the second photoresist to expose the solder contact, which overlies an under bump metallurgy (UBM) structure in an exemplary embodiment herein.

Referring to FIG. 16, the patterned second photoresist 1380 may be removed by wet stripping to expose the solder contact 1262, which overlies an under bump metallurgy (UBM) structure 1630 including the barrier layer 1136, the highly conductive layer 734, and the base layer 632 in an exemplary embodiment herein.

Figure 17:
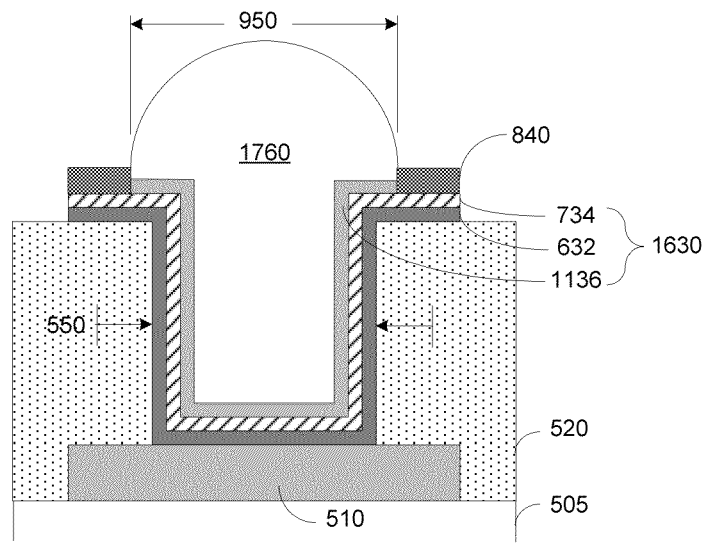
FIG. 17 is a schematic diagram illustrating, in cross section, a method of making a solder ball contact yet further including reflowing the solder contact to form a solder ball contact in an exemplary embodiment herein.

Referring to FIG. 17, the solder contact 1262 may be reflowed at about 240° C. to form a solder ball contact 1760, which has a diameter greater than that of the first via 550 and less than that of an outer diameter of the UBM structure 1630 in an exemplary embodiment herein. Preferably, the diameter of the solder ball 360 is less than one-half the outer diameter of the UBM structure 330. Preferably, the diameter of the solder ball 360 may be 60% to 90% the outer diameter of the UBM structure 330.

Figure 18:
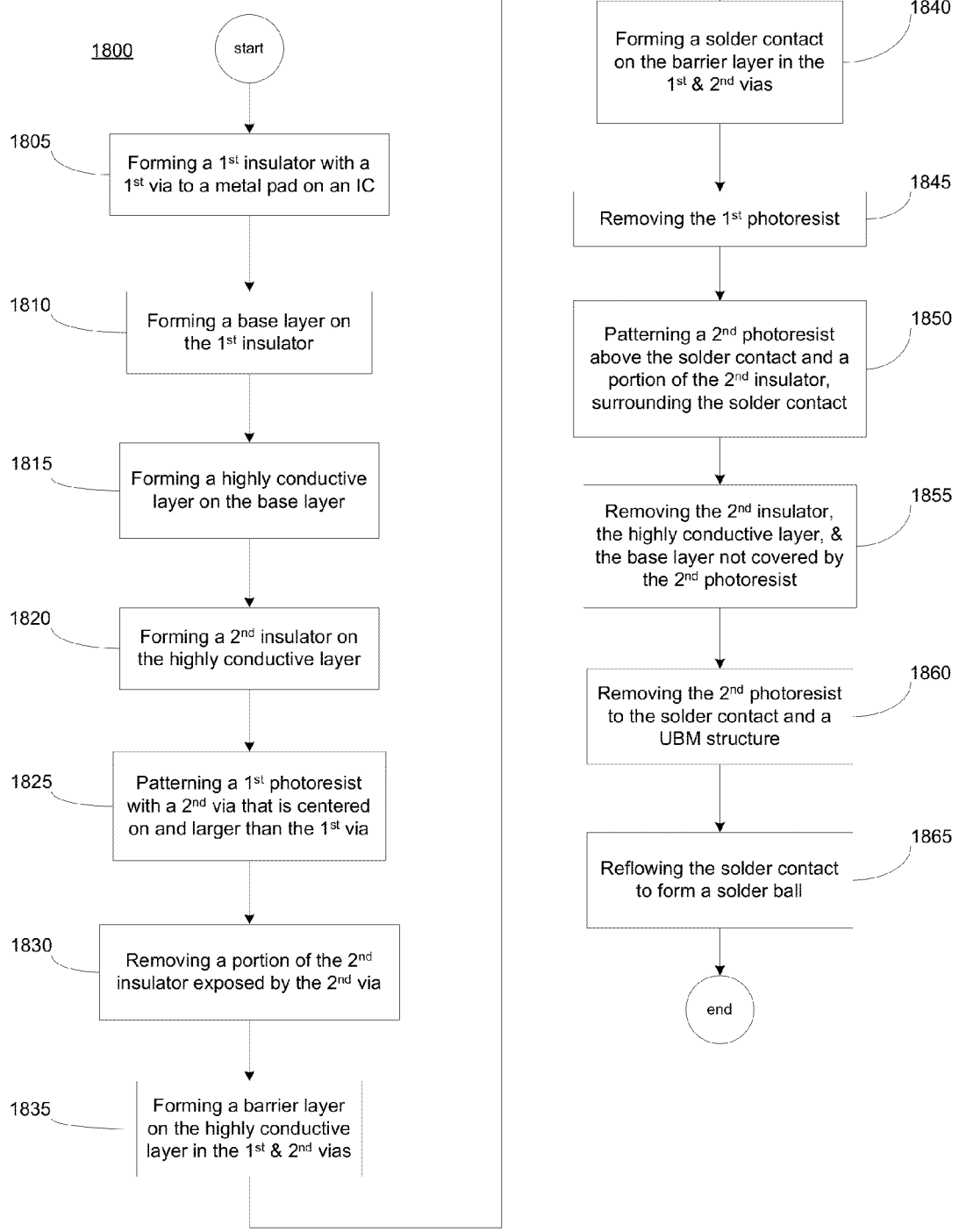
FIG. 18 is a flow chart illustrating a method of making a solder ball contact in an exemplary embodiment herein.

Referring to FIG. 18, a flow chart 1800 illustrates a method of making a solder ball contact in an exemplary embodiment herein. The method may include depositing and patterning a first insulating layer on an IC chip and a metal pad, in which the first insulating layer includes a first via to the metal pad 1805. The first insulating layer may include any of a polyimide, polybenzoxazole (PBO) and bisbenzocyclotene (BCB) to cushion a to-be-formed under ball metallurgy structure against delaminating stress. The method may also include depositing a base layer on the first insulating layer, including sides of the first via, and on a top surface of the metal pad 1810. The base layer may include any of a TiW, Ti, and Cr/CrCu layer to promote adhesion to the first insulating layer. The method may further include forming a highly conductive layer on the base layer 1815. The highly conductive layer may include any of Cu, Au, and Al to facilitate subsequent electroplating of a barrier layer and a solder contact. The method may yet further include depositing a second insulating layer on the highly conductive layer 1820. The second insulating layer may include a silicon nitride or silicon oxide upon which a to-be-formed solder contact will not reflow. The method may yet further include depositing and patterning a first photoresist to include a second via that shares a central axis with and has a greater diameter than the first via, in which the second via exposes a first portion of the second insulating layer located within the first and second vias 1825. The method may yet further include removing the first portion of the second insulating layer 1830. The method may yet further include forming a barrier layer on the highly conductive layer within the first and second vias 1835. The forming of the barrier layer may include electroplating any of a Ni, FeNi, Co, Ta, and CoFe layer on the highly conductive layer within the first and second vias. The method may yet further include forming a solder contact on the barrier layer within the first and second vias 1840. The forming of the solder contact may include electroplating, screening, or vapor depositing a solder on the barrier layer, within the first and second vias, to a level above that of a top surface of the second insulating layer, which is covered by the first photoresist. The solder contact may include any of a Pb-free solder that may include any of Sn, Ag, Cu, Bi, Zn, and Sb. The method may yet further include removing the first photoresist 1845. The method may yet further include depositing and patterning a second photoresist above the solder contact and a second portion of the second insulating layer that surrounds the solder contact 1850. The method may yet further include removing the second insulating layer, the highly conductive layer, and the base layer not covered by the second photoresist 1855. The method may yet further include removing the second photoresist to expose the solder contact, which overlies an under bump metallurgy (UBM) structure including the barrier layer, the highly conductive layer, and the base layer 1860. Finally, the method may yet further include reflowing the solder contact to form a solder ball contact 1865. A diameter of a solder ball may greater than a diameter of the first via and less than an outer diameter of the UBM structure. Preferably, the diameter of the solder ball may be 60% to 90% of the outer diameter of the UBM.

The terminology used herein is for the purpose of describing particular embodiments only and is not intended to be limiting herein. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the embodiments herein has been presented for purposes of illustration and description, but is not intended to be exhaustive or limited to the embodiments herein. Many modifications and variations will be apparent to those of ordinary skill in the art without departing from the scope and spirit of the embodiments herein. The embodiment was chosen and described in order to best explain the principles of the embodiments herein and the practical application, and to enable others of ordinary skill in the art to understand the embodiments herein for various embodiments with various modifications as are suited to the particular use contemplated.

What is claimed is:

1. A solder ball contact, comprising:
    a first insulating layer disposed on an integrated circuit (IC) chip and a metal pad, said first insulating layer including a via to said metal pad;
    an under bump metallurgy (UBM) structure disposed on sides of said via, on a top surface of said metal pad, and on a portion of a top surface of said first insulating layer, surrounding said via;
    a second insulating layer disposed on an upper surface of an outer portion of said UBM structure that is centered on said via; and
    a solder ball that fills said via and is disposed above said upper surface of an inner portion of said UBM structure that contacts said via,
    said second insulating layer having a vertical inner surface and a vertical outer surface, wherein said vertical inner surface of said second insulating layer is aligned with a vertical inner top surface portion of said UBM structure, wherein said vertical outer surface of said second insulating layer is aligned with a vertical outer bottom surface portion of said UBM structure,
    said second insulating layer having an inner edge that delimits a diameter of said solder ball, and
    said solder ball having the diameter that is 60% to 90% an outer diameter of said UBM structure.

2. The solder ball contact of claim 1, said UBM structure comprising a metal stack including:
    a lowermost base layer that adheres to said first insulating layer;
    a conductive layer; and
    an uppermost barrier layer that separates said conductive layer from said solder ball.

3. The solder ball contact of claim 2, wherein:
    said lowermost base layer comprises any of titanium and tungsten (TiW), Ti, and a chromium/chromium-copper alloy (Cr/CrCu);
    said conductive layer comprises any of copper (Cu), gold (Au), and aluminum (Al); and
    said uppermost barrier layer comprises any of nickel (Ni), an iron-nickel alloy (FeNi), cobalt (Co), tantalum (Ta), and a cobalt-iron alloy (CoFe).

4. The solder ball contact of claim 1, said first insulating layer comprising any of a polyimide, polybenzoxazole (PBO) and bisbenzocyclotene (BCB).

5. The solder ball contact of claim 1, said second insulating layer comprising one of silicon nitride and silicon oxide.

6. The solder ball contact of claim 1, wherein said solder ball comprises a lead (Pb)-free solder including any of tin (Sn), silver (Ag), copper (Cu), bismuth (Bi), zinc (Zn), and antimony (Sb).

7. A solder ball contact, comprising:
    a first insulating layer disposed on an integrated circuit (IC) chip and a metal pad, said first insulating layer including a via to said metal pad;
    an under bump metallurgy (UBM) structure disposed on sides of said via, on a top surface of said metal pad, and on a portion of a top surface of said first insulating layer, surrounding said via;
    a second insulating layer disposed on an upper surface of an outer portion of said UBM structure that is centered on said via; and
    a solder ball that fills said via and is disposed above said upper surface of an inner portion of said UBM structure that contacts said via,
    wherein said second insulating layer comprising an inner edge, an inner vertical surface and an outer vertical surface, said inner edge of said second insulating layer delimiting a diameter of said solder ball, said inner vertical surface of said second insulating layer being aligned with a vertical inner top surface portion of said UBM structure, said outer vertical surface said second insulating layer being aligned with a vertical outer bottom surface portion of said UBM structure, said solder ball having the diameter that is 60% to 90% an outer diameter of said UBM structure.

8. The solder ball contact of claim 7, said UBM structure comprising a metal stack including:
- a lowermost base layer that adheres to said first insulating layer;
- a conductive layer; and
- an uppermost barrier layer that separates said conductive layer from said solder ball.

9. The solder ball contact of claim 8, wherein:
- said lowermost base layer comprises any of titanium and tungsten (TiW), Ti, and a chromium/chromium-copper alloy (Cr/CrCu);
- said conductive layer comprises any of copper (Cu), gold (Au), and aluminum (Al); and
- said uppermost barrier layer comprises any of nickel (Ni), an iron-nickel alloy (FeNi), cobalt (Co), tantalum (Ta), and a cobalt-iron alloy (CoFe).

10. The solder ball contact of claim 7, said first insulating layer comprising any of a polyimide, polybenzoxazole (PBO) and bisbenzocyclotene (BCB).

11. The solder ball contact of claim 7, said second insulating layer comprising one of silicon nitride and silicon oxide.

12. The solder ball contact of claim 7, wherein said solder ball comprises a lead (Pb)-free solder including any of tin (Sn), silver (Ag), copper (Cu), bismuth (Bi), zinc (Zn), and antimony (Sb).

13. A solder ball contact, comprising:
- a first insulating layer disposed on an integrated circuit (IC) chip and a metal pad, said first insulating layer including a via to said metal pad;
- an under bump metallurgy (UBM) structure disposed on sides of said via, on a top surface of said metal pad, and on a portion of a top surface of said first insulating layer, surrounding said via;
- a second insulating layer disposed on an upper surface of an outer portion of said UBM structure that is centered on said via; and
- a solder ball that fills said via and is disposed above said upper surface of an inner portion of said UBM structure that contacts said via,
- wherein said second insulating layer comprising an inner edge, an inner vertical surface and an outer vertical surface, said inner edge of said second insulating layer delimiting a diameter of said solder ball, said inner vertical surface of said second insulating layer being aligned with a vertical inner top surface portion of said UBM structure, said outer vertical surface said second insulating layer being aligned with a vertical outer bottom surface portion of said UBM structure
- said solder ball having the diameter that is larger than a diameter of said via and is 60% to 90% an outer a diameter of said UBM structure.

14. The solder ball contact of claim 13, said UBM structure comprising a metal stack including:
- a lowermost base layer that adheres to said first insulating layer;
- a conductive layer; and
- an uppermost barrier layer that separates said conductive layer from said solder ball.

15. The solder ball contact of claim 14, wherein:
- said lowermost base layer comprises any of titanium and tungsten (TiW), Ti, and a chromium/chromium-copper alloy (Cr/CrCu);
- said conductive layer comprises any of copper (Cu), gold (Au), and aluminum (Al); and
- said uppermost barrier layer comprises any of nickel (Ni), an iron-nickel alloy (FeNi), cobalt (Co), tantalum (Ta), and a cobalt-iron alloy (CoFe).

16. The solder ball contact of claim 13, said first insulating layer comprising any of a polyimide, polybenzoxazole (PBO) and bisbenzocyclotene (BCB).

17. The solder ball contact of claim 13, said second insulating layer comprising one of silicon nitride and silicon oxide.

18. The solder ball contact of claim 13, wherein said solder ball comprises a lead (Pb)-free solder including any of tin (Sn), silver (Ag), copper (Cu), bismuth (Bi), zinc (Zn), and antimony (Sb).

* * * * *